(12) United States Patent
Park et al.

(10) Patent No.: US 8,772,725 B2
(45) Date of Patent: Jul. 8, 2014

(54) PHOTO DETECTOR AND OPTICAL DEVICE

(71) Applicant: Electronics and Telecommunications Research Institute, Daejeon (KR)

(72) Inventors: Jeong Woo Park, Daejeon (KR); Kyung Hyun Park, Daejeon (KR); Han-Cheol Ryu, Daejeon (KR); Dong-Hun Lee, Daejeon (KR); Sang-Pil Han, Daejeon (KR); Hyunsung Ko, Seoul (KR); Namje Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 13/840,956

(22) Filed: Mar. 15, 2013

(65) Prior Publication Data

US 2013/0299701 A1 Nov. 14, 2013

(30) Foreign Application Priority Data

May 14, 2012 (KR) .......................... 10-2012-0051117

(51) Int. Cl.
*G01J 5/02* (2006.01)

(52) U.S. Cl.
USPC ....................................................... 250/341.1

(58) Field of Classification Search
USPC ...................... 250/338.1–338.5, 341.1–341.8
See application file for complete search history.

(56) References Cited

U.S. PATENT DOCUMENTS

| | | | |
|---|---|---|---|
| 5,991,473 A | 11/1999 | Nishikata et al. | |
| 6,573,737 B1 * | 6/2003 | Lyon et al. | 324/754.23 |
| 7,851,782 B2 | 12/2010 | Seeds et al. | |
| 8,405,031 B2 * | 3/2013 | Katagiri | 250/338.4 |
| 2004/0145026 A1 * | 7/2004 | Sun et al. | 257/459 |
| 2010/0135337 A1 * | 6/2010 | Belkin et al. | 372/4 |
| 2011/0057206 A1 * | 3/2011 | Sartorius et al. | 257/85 |
| 2011/0291158 A1 * | 12/2011 | Ogura et al. | 257/187 |
| 2012/0261576 A1 | 10/2012 | Tomioka | 250/338.1 |
| 2013/0294467 A1 * | 11/2013 | Moloney et al. | 372/20 |

OTHER PUBLICATIONS

Hindle et al., "Continuous-wave terahertz by photomixing: applications to gas phase pollutant detection and quantification," 2008, C.R. Physique, vol. 9, pp. 262-275.*
Lisauskas et al., "Concept of internal mixing in semiconductor lasers and optical amplifiers for room-temperature generation of tunable continuous terahertz waves," 2008, Physica E, vol. 40, pp. 1968-1970.*
Tadao Ishibashi et al., "InP/InGaAs Uni-Traveling-Carrier Photodiodes", IEICE Trans. Electron., Jun. 2000, pp. 938-949, vol. E83-C, No. 6.

* cited by examiner

*Primary Examiner* — Kiho Kim
(74) *Attorney, Agent, or Firm* — Rabin & Berdo, P.C.

(57) ABSTRACT

An optical device may include first and second lasers generating first and second laser beams; and a photo detector detecting the first and second laser beams. The optical detector comprises a substrate, a first impurity layer on the substrate, an absorption layer on the first impurity layer and a second impurity layer on the absorption layer. The absorption layer generates a terahertz by a beating of the first and second laser beams and has a thickness of less than 0.2 μm.

16 Claims, 5 Drawing Sheets

PHOTO DETECTOR AND OPTICAL DEVICE

CROSS-REFERENCE TO RELATED APPLICATIONS

This U.S. non-provisional patent application claims priority under 35 U.S.C. §119 of Korean Patent Application No. 10-2012-0051117, filed on May 14, 2012, the entire contents of which are hereby incorporated by reference.

BACKGROUND

The present inventive concept herein relates to optical devices, and more particularly, to a photo detector and an optical device including the photo detector.

A photo detector is a device that is essentially used in an optical communication. The photo detector converts light into an electric signal. The photo detector requires high responsivity, a high operation speed, a high power capability, etc. Responsivity represents how many photocurrents are generated with respect to input optical signal and may correspond to receiving sensitivity. An operation speed is standards for processing large amounts of data. A power capability is one of important factors for realizing a long-distance communication. An optical amplifier is disposed at every certain distance to compensate loss being generated in a long-distance communication. At this time, a high power input may enter a photo detector. Thus, the photo detector has to smoothly operate with respect to the high power input.

A photo detector is being used in the field of photomixer. The photomixer has a similar function to a radio frequency mixer. For instance, if a radio frequency signal having frequencies $f_1$ and $f_2$ is input to the radio frequency mixer, the radio frequency mixer can generate radio a frequency component $f_1$-$f_2$ (where, $f_1$>$f_2$). Similarly, if a laser beam having different frequencies from each other is input to a photomixer, the photomixer can output an electric signal having a frequency component corresponding to a difference of the input frequencies. That is, the photomixer can generate a high speed electric signal of terahertz wave using a laser beam. Thus, the photomixer can have high responsivity, a high operation speed and a high power capability. The high responsivity is an important factor as standards for increasing an efficiency of converting a laser beam into an electric signal. When the photomixer has a high operation frequency, it can output a high speed electric signal of terahertz wave. Also, the photomixer can operate at high speed in proportion to an input power of optical signal. The photo detector and the photomixer for optical communication have different uses but same performance is required for the photo detector and the photomixer.

SUMMARY

Embodiments of the inventive concept provide an optical device. The optical device may include a laser generating first and second laser beams; and a photo detector detecting the first and second laser beams. The optical detector comprises a substrate, a first impurity layer on the substrate, an absorption layer on the first impurity layer and a second impurity layer on the absorption layer. The absorption layer generates a terahertz by a beating of the first and second laser beams and has a thickness of less than 0.2 μm.

Embodiments of the inventive concept also provide a photo detector. The photo detector may include a substrate; a first impurity layer on the substrate; an absorption layer on the first impurity layer; and a second impurity layer on the absorption layer. The absorption layer has a thickness of less than 0.2 μm.

BRIEF DESCRIPTION OF THE FIGURES

Preferred embodiments of the inventive concept will be described below in more detail with reference to the accompanying drawings. The embodiments of the inventive concept may, however, be embodied in different forms and should not be constructed as limited to the embodiments set forth herein. Rather, these embodiments are provided so that this disclosure will be thorough and complete, and will fully convey the scope of the inventive concept to those skilled in the art. Like numbers refer to like elements throughout.

DETAILED DESCRIPTION OF THE EMBODIMENTS

Figure 1:
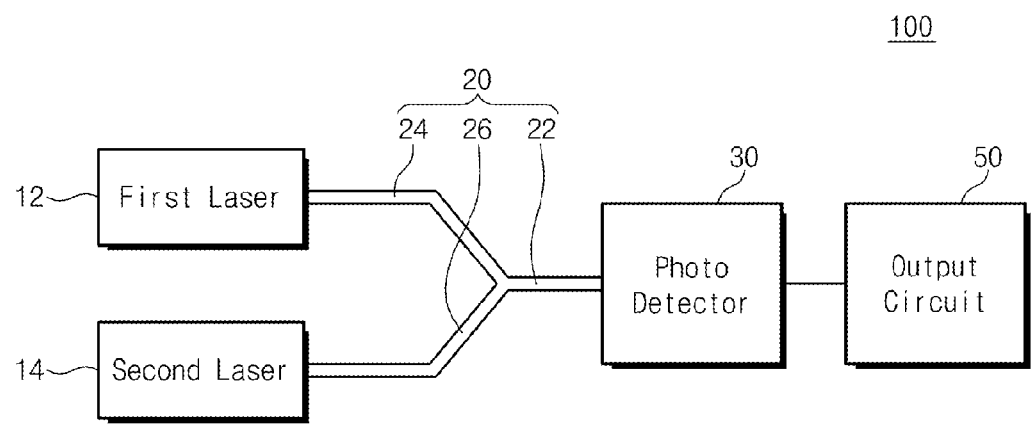
FIG. 1 is a cross sectional view illustrating an optical device in accordance with a first embodiment of the inventive concept.

Embodiments of inventive concepts will be described more fully hereinafter with reference to the accompanying drawings, in which embodiments of the invention are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

FIG. 1 is a cross sectional view illustrating an optical device 100 in accordance with a first embodiment of the inventive concept.

Referring to FIG. 1, the optical device 100 may include a first laser 12, a second laser 14, an optical waveguide 20, a photo detector 30 and an output circuit 50. The first and second lasers 12 and 14 can generate a first laser beam and a second laser beam respectively that have different wavelengths from each other. The first laser beam may be a main input optical signal and the second laser beam may be a sub input optical signal. For example, the first laser beam may have a wavelength of about 1550 nm and the second laser beam may have a wavelength of about 1551 to 1560 nm.

The optical waveguide 20 may be disposed between the photo detector 30 and the first and second lasers 12 and 14. The optical waveguide 20 may include a joint waveguide 22 connected to the photo detector 30, a first branch waveguide 24 connected between the joint waveguide 22 and the first laser 12 and a second branch waveguide 26 connected between the joint waveguide 22 and second laser 14.

The photo detector 30 absorbs the first and second laser beams being transmitted through the optical waveguide 20 to output a terahertz wave by a beating of the first and second laser beams. That is, the photo detector 30 can generate a terahertz wave corresponding to a difference between wavelengths of the first and second laser beams.

The output circuit 50 can receive a terahertz wave being generated from the photo detector 30. The output circuit 50 may include a terahertz wave instrumentation device and/or an antenna.

Figure 2:
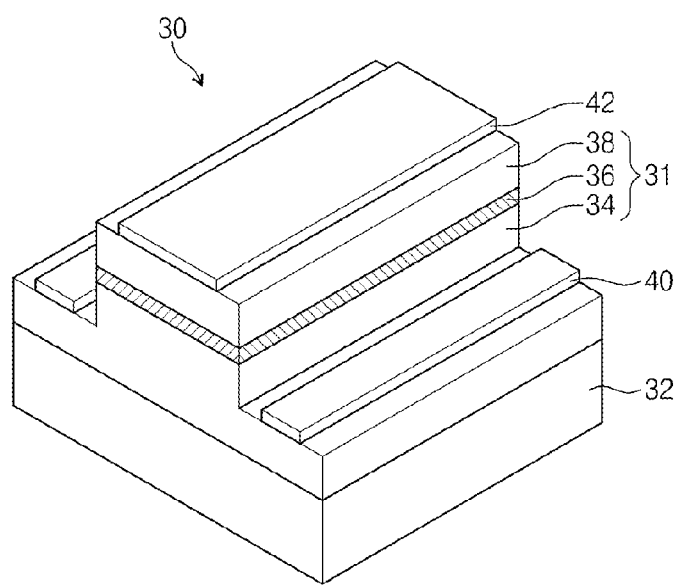
FIG. 2 is a perspective view illustrating a photo detector of FIG. 1.

FIG. 2 is a perspective view illustrating a photo detector of FIG. 1.

Referring to FIG. 2, the photo detector 30 may include a substrate 32, a first impurity layer 34 on the substrate 32, an absorption layer 36 on the first impurity layer 34 and a second impurity layer 38 on the absorption layer 36. The substrate 32 may include silicon single crystal, indium phosphide InP or gallium arsenide GaAs. The first impurity layer 34, the absorption layer 36 and the second impurity layer 38 may be a ridge waveguide 31 extending in a specific direction. The ridge waveguide 31 can protrude from the substrate 32.

The first impurity layer 34 may include indium phosphide InP doped with a first conductivity type. The first conductivity type may be an N type. First electrodes 40 may be disposed on the first impurity layer 34 of both sides of the absorption layer 36 and the second impurity layer 38. The second impurity layer 38 may include indium phosphide InP doped with a second conductivity type opposite to the first conductivity type. The second conductivity type may be a P type. A second electrode 42 may be disposed on the second impurity layer 38.

The absorption layer 36 can absorb first and second laser beams being transmitted through the optical waveguide 20 to generate a terahertz wave. The absorption layer 36 may include intrinsic indium gallium arsenic (InGaAs). A characteristic of the photo detector 30 can be influenced by a thickness of the absorption layer 36. The thickness of the absorption layer 36 can determine an operation speed and responsivity of the photo detector 30. The thick absorption layer 36 absorbs a large quantity of laser beams to increase responsivity. The thin absorption layer 36 can increase an operation speed of the photo detector 30 due to a reduction of a distance between the first impurity layer 34 and the second impurity layer 38.

Figure 3:
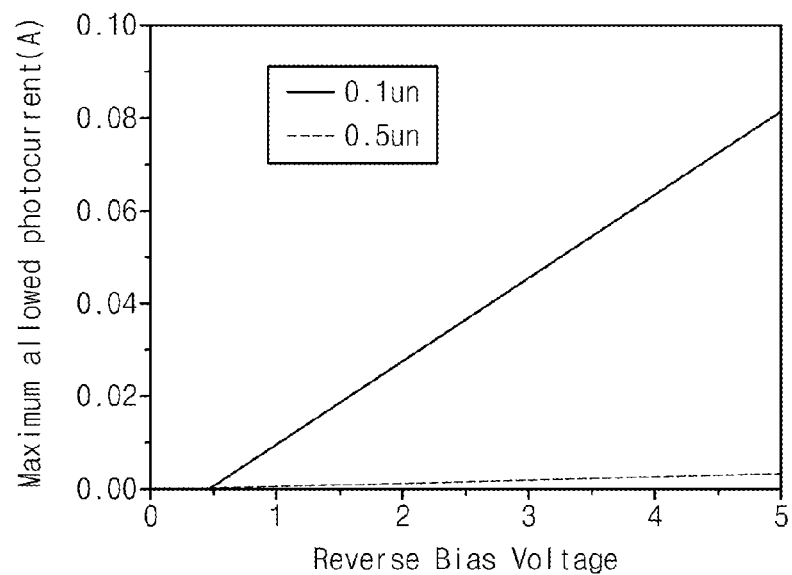
FIG. 3 is a graph showing a maximum allowed photocurrent relative to a thickness of absorption layer.

FIG. 3 is a graph showing a maximum allowed photocurrent relative to a thickness of absorption layer. A horizontal axis represents a reverse bias voltage applied between the first electrode 40 and the second electrode 42 and a vertical axis represents a maximum allowed optical current.

Referring to FIGS. 1 through 3, when the absorption layer 36 is thin, it can generate a high maximum allowed optical current. For instance, the absorption layer 36 having a thickness of 0.1 μm can generate a maximum allowed optical current that increases to 0.08 A in proportion to a bias voltage of 5V or less. The bias voltage can applied from the output circuit 50.

The absorption layer 36 having a thickness of 0.5 μm can generate a maximum allowed optical current of 0.01 A or less. Thus, the absorption layer 36 can increase a maximum allowed input power in inverse proportion to its thickness.

The output circuit 50 may have an internal resistance of about 100Ω. The ridge waveguide 31 between the first electrode 40 and the second electrode 42 may have resistance and/or impedance in accordance with a bias voltage. The ridge waveguide 31 may have resistance and/or impedance being changed according to its area. The resistance and/or impedance of the ridge waveguide 31 can be determined by a thickness of each of the first and second impurity layers 34 and 38 and the absorption layer 36 and doping concentrations of the first and second impurity layers 34 and 38. The photo detector 30 may be a travelling-wave photo detector. The travelling-wave photo detector matches resistance and/or impedance of the ridge waveguide 31 to internal resistance of the output circuit 50. The travelling-wave photo detector can allow an error to the extent of about 50% between the resistance and/or impedance of the ridge waveguide 31 and the internal resistance of the output circuit 50.

Thus, since the optical device 100 in accordance with the first embodiment of the inventive concept includes a travelling-wave photo detector, it can show maximum performance.

Figure 4:
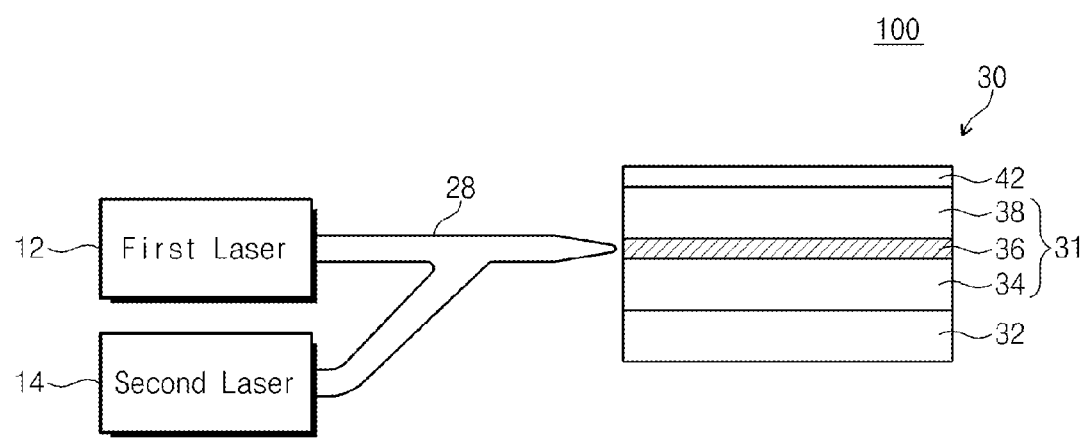
FIG. 4 is a drawing illustrating an optical device in accordance with a second embodiment of the inventive concept.

FIG. 4 is a drawing illustrating an optical device in accordance with a second embodiment of the inventive concept.

Referring to FIG. 4, the optical device 100 may include a lensed optical fiber 28 which is disposed between the photo detector 30 and the first and second lasers 12 and 14 and focuses first and second laser beams on the photo detector 30. The lensed optical fiber 28 may be arranged in the absorption layer 36.

As described above, the photo detector 30 can generate an electric signal of terahertz wave by a beating of the first and second laser beams. At this time, an operation speed of the photo detector 30 can be determined by transit time and a resistance capacitance (RC) effect of an electron and/or a hole generated from the absorption layer 36. The transit time is elapsed time when an electron and/or a hole in the absorption layer 36 reaches the first impurity layer 34 and the second impurity layer 38. The RC effect is a factor disturbing movement of electrons and/or holes.

In a low frequency band of about 100 GHz or less, a general optical communication does not have speed restrictions of an electron and/or a hole by transit time and an RC effect. The transit time and the RC effect may become important factors with respect to a speed of an electron and/or a hole in an optical communication of a terahertz wave band. When the photo detector 30 detects a laser beam signal of a frequency band of 40 GHz, the absorption layer 36 may have a thickness of about 0.5 μm. At this time, a transit limited bandwidth may be about 62 GHz. When the photo detector 30 is used as a photomixer of terahertz frequency band and/or a terahertz wave generator, it has a low operation speed by a limit of transit time. Thus, a thickness of the absorption layer 36 has to be small. When the absorption layer 36 is thin, capacitance may become large. If a size of the photo detector 30 is small, capacitance may be reduced.

To overcome this restriction of operating frequency, we can use a travelling-wave scheme, which is not under RC limitation. We can overcome RC limitation with usage of travelling-wave scheme. A basic of travelling-wave scheme is an matching characteristic impedance of photo detector to external circuits.

The lensed optical fiber 28 is not coupled to the photo detector 30 and may be spaced apart from the photo detector 30. When the first and second laser beams having a similar size are transmitted to the lensed optical fiber 28 and the photo detector 30, coupling loss may be reduced. Generally, when the lensed optical fiber 28 and the absorption layer 36 have a similar thickness, a coupling efficiency may be high. However, when the absorption layer 36 becomes thick, an operation speed for generation of terahertz wave may be slowed down. Thus, a coupling efficiency can be checked by comparing beam widths in the lensed optical fiber 28 and the ridge waveguide 31.

Figure 5:
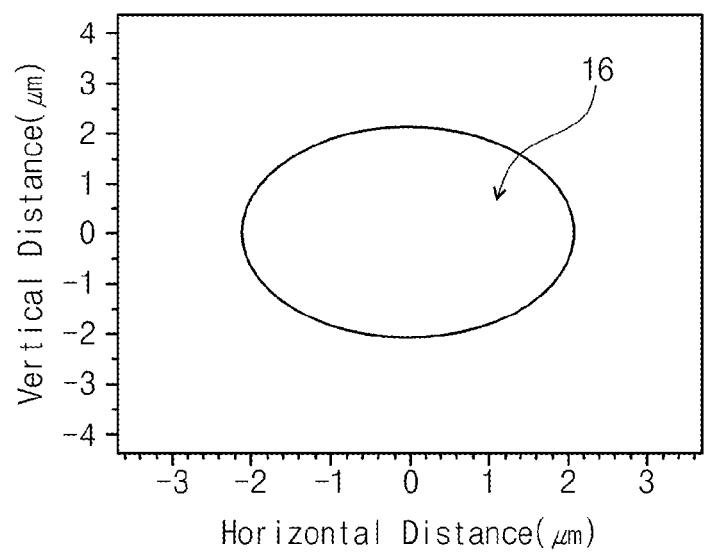
FIG. 5 is a drawing illustrating a beam width of first and second laser beams being transmitted from a lensed optical fiber.

FIG. 5 is a drawing illustrating a beam width of first and second laser beams being transmitted from a lensed optical fiber 28.

Referring to FIG. 5, the lensed optical fiber 28 can output first and second laser beams 16 having a beam width of about 3 to 3.5 μm. The beam width can be defined by a vertical line width of the first and second laser beams 16. The first and second laser beams 16 in the lensed optical fiber 28 can be simulated. At this time, the first and second laser beams 16 may have the same beam width in the lensed optical fiber 28.

FIGS. 6 through 9 are drawings illustrating first and second laser beams having different beam widths from each other with respect to absorption layers having 0.3 μm, 0.2 μm, 0.1 μm and 0.05 μm respectively. A horizontal axis and a vertical axis represent a horizontal distance and a vertical distance respectively. The beam width can be represented by a vertical distance of the first and second laser beams 16.

Figure 6:
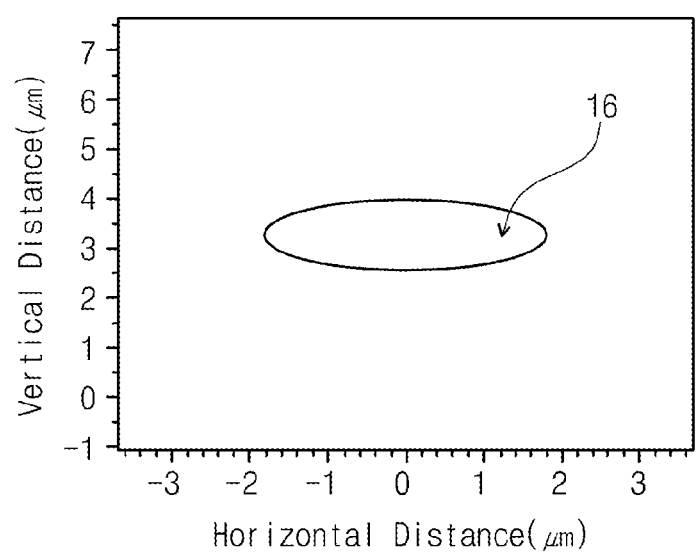
FIGS. 6 through 9 are drawings illustrating first and second laser beams having different beam widths from each other with respect to absorption layers having 0.3 μm, 0.2 μm, 0.1 μm and 0.05 μm respectively.
Figure 7:
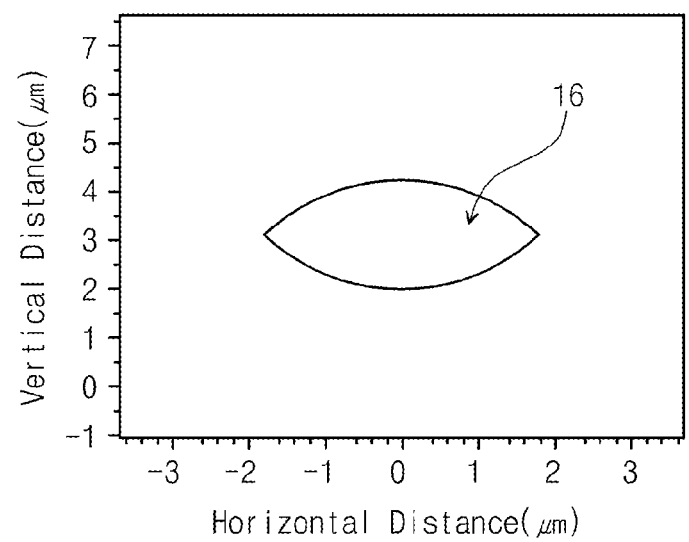

Referring to FIGS. 2, 4 to 9, when the absorption layer 36 has a thickness of less than 0.2 μm, the ridge waveguide 31 can absorb the first and second laser beams 16 having a beam width of more than 0.5 times that of the lensed optical fiber 28. The first and second laser beams 16 in the ridge waveguide 31 can be simulated as a beam width being changed according to a thickness of the absorption layer 36. For instance, if the first and second laser beams 16 having a beam width of about 3 to 3.5 μm from the lensed optical fiber 28 enter the photo detector 30, the ridge waveguide 31 having the absorption layer 36 of a thickness of about 0.3 μm can absorb the first and second laser beams 16 as a beam width of about 1 μm (FIG. 6). At this time, the ridge waveguide 31 can absorb the first and second laser beams 16 having a beam width of less than 0.5 times that of the lensed optical fiber 28. Thus, the absorption layer 36 having a thickness of more than 0.2 μm can generate coupling loss of the first and second laser beams 16.

Figure 8:
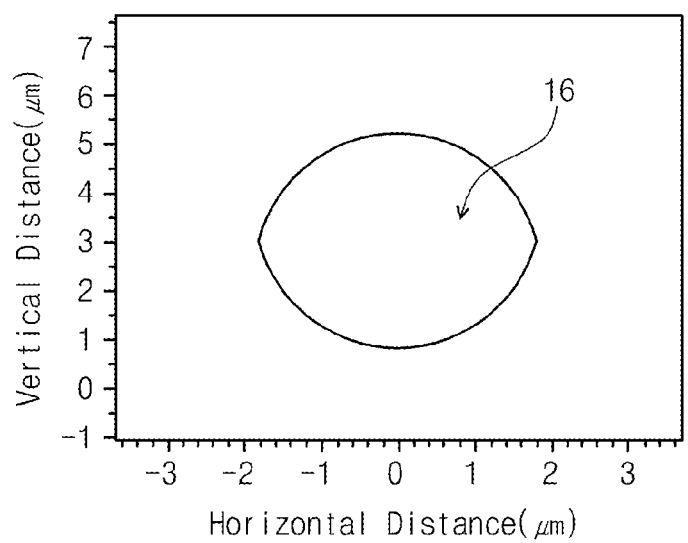
Figure 9:
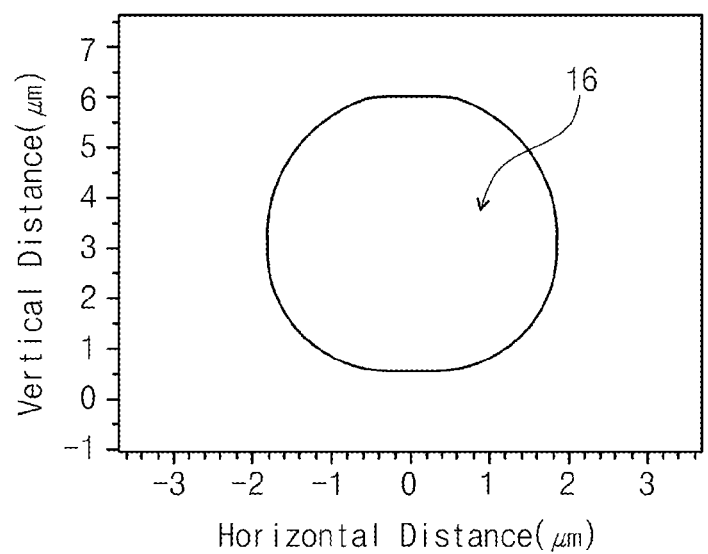

When the absorption layer 36 has a thickness of about 0.1 μm, it can absorb the first and second laser beams 16 having a beam width of about 3 μm similar to that in the lensed optical fiber 28 (FIG. 8). At this time, a coupling efficiency of the ridge waveguide 31 and the lensed optical fiber 28 may be maximally heightened. The absorption layer 36 of a thickness of about 0.05 μm can absorb the first and second laser beams 16 having a beam width of about 4 μm (FIG. 9). The absorption layer 36 may ideally have a thickness of about 0.005 μm.

Thus, the optical device 100 in accordance with the second embodiment of the inventive concept may have a high coupling efficiency with respect to the absorption layer 36 having a thickness of less than 0.2 μm. Although not illustrated in the drawing, the optical device 100 in accordance with the second embodiment may further include the output circuit 50 connected to the photo detector 30. Also, the photo detector 30 may be a travelling-wave type photo detector matching the ridge waveguide 31 of resistance and/or impedance to an internal resistance of the output circuit 50.

An optical device in accordance with some embodiments of the inventive concept may include first and second lasers, an optical waveguide connected to the first and second lasers and a photo detector which is connected to the optical waveguide and has an absorption layer having a thickness of less than 0.2 μm. The photo detector can generate a terahertz wave by a beating of first and second laser beams generated from the first and second lasers. When the absorption layer has a thickness of 0.1 μm, it can generate a maximum allowed photocurrent of about 0.08 A. When the absorption layer has a thickness of 0.5 μm, it can generate a maximum allowed photocurrent of less than 0.01 A. Thus, the absorption layer can increase a maximum allowed input power in inverse proportion to its thickness.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. An optical device comprising:
a laser generating first and second laser beams; and
a photo detector detecting the first and second laser beams,
wherein the optical detector comprises a substrate, a first impurity layer on the substrate, an absorption layer on the first impurity layer and a second impurity layer on the absorption layer, and
wherein the absorption layer generates a terahertz by a beating of the first and second laser beams and has a thickness of less than 0.2 μm.

2. The optical device of claim 1, wherein the absorption layer has a thickness of 0.005 μm or more.

3. The optical device of claim 2, wherein the first impurity layer, the absorption layer and the second impurity layer are a ridge waveguide extending in a specific direction.

4. The optical device of claim 3, wherein the photo detector further comprises a first electrode formed on the first impurity layer of both sides of the absorption layer and a second electrode formed on the second impurity.

5. The optical device of claim 3, further comprising an optical waveguide between the laser and the photo detector.

6. The optical device of claim 5, wherein the optical waveguide comprises a lensed optical fiber.

7. The optical device of claim 6, wherein the ridge waveguide has a beam width of more than 0.5 times that of the lensed optical fiber and absorbs the first and second laser beams.

8. The optical device of claim 1, wherein the absorption layer comprises intrinsic indium gallium arsenic.

9. The optical device of claim 1, wherein the laser comprises a first laser and a second laser generating the first and second beams etch other.

10. The optical device of claim 1, wherein the optical waveguide comprises a joint waveguide connected to the photo detector, a first branch waveguide connected between the joint waveguide and the first laser and a second branch waveguide connected between the joint waveguide and the second laser.

11. The optical device of claim 1, further comprising an output circuit receiving a terahertz wave being output by a beating of the first and second laser beams from the optical detector.

12. The optical device of claim 11, wherein the photo detector is a travelling-wave type photo detector matching impedance of the output circuit to characteristic impedance of photo detector.

13. The optical device of claim 12, wherein the photo detector is a travelling-wave type photo detector with an input resistor of which impedance match to a characteristic impedance of the travelling-wave type photo detector.

14. The optical device of claim 1, wherein the photo detector is a travelling-wave type photo detector with an input resistor of which impedance match to a characteristic impedance of a travelling-wave type photo detector.

15. A photo detector comprising:
a substrate;
a first impurity layer on the substrate;
an absorption layer on the first impurity layer; and
a second impurity layer on the absorption layer, wherein the absorption layer has a thickness of less than 0.2 µm.

16. The photo detector of claim 15, wherein the absorption layer has a thickness of 0.005 µm or more.

* * * * *